(12) United States Patent
Morii

(10) Patent No.: US 8,265,787 B2
(45) Date of Patent: Sep. 11, 2012

(54) SUBSTRATE PROCESSING APPARATUS AND SUBSTRATE PROCESSING METHOD

(75) Inventor: Kojiro Morii, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 568 days.

(21) Appl. No.: 12/448,026

(22) PCT Filed: Dec. 4, 2007

(86) PCT No.: PCT/JP2007/073399
§ 371 (c)(1),
(2), (4) Date: Sep. 16, 2009

(87) PCT Pub. No.: WO2008/069203
PCT Pub. Date: Jun. 12, 2008

(65) Prior Publication Data
US 2010/0017015 A1 Jan. 21, 2010

(30) Foreign Application Priority Data
Dec. 5, 2006 (JP) .................................. 2006-327976

(51) Int. Cl.
*G06F 19/00* (2011.01)
*G06F 17/00* (2006.01)
*G05B 15/00* (2006.01)

(52) U.S. Cl. ........ 700/214; 700/192; 700/245; 700/259; 700/114; 700/109; 700/121

(58) Field of Classification Search ........................ None
See application file for complete search history.

(56) References Cited

FOREIGN PATENT DOCUMENTS

| JP | 02-283097 A | | 11/1990 |
|---|---|---|---|
| JP | 2000-267253 A | | 9/2000 |
| JP | 2002-200543 A | | 7/2002 |
| JP | 2003-059808 A | | 2/2003 |
| JP | 2003059808 A | * | 2/2003 |
| JP | 2003-251257 A | | 9/2003 |
| JP | 2003251257 A | * | 9/2003 |

* cited by examiner

*Primary Examiner* — Gene Crawford
*Assistant Examiner* — Yolanda Jones
(74) *Attorney, Agent, or Firm* — Edwards Wildman Palmer LLP; David G. Conlin; David A. Tucker

(57) ABSTRACT

Based on the positions of a first marker and a second marker of a first substrate placed on a placing surface of a substrate placing table (1), a substrate processing apparatus makes the direction of a line connecting the first marker and the second marker accord with the moving direction of a gantry (2). The positions of the first marker and a third marker, in the state that the direction of the line connecting the first marker and the second marker accord with the moving direction, are stored in a storage section. After a second substrate is placed on the placing surface of the substrate placing table (1), the direction of a line connecting the first marker and the third marker on the second substrate is made to accord with the direction of a line connecting the first marker and the third marker calculated from the position of the third marker and the fourth marker on the first substrate stored in the storage section.

18 Claims, 14 Drawing Sheets

GanY

GanY

SUBSTRATE PROCESSING APPARATUS AND SUBSTRATE PROCESSING METHOD

TECHNICAL FIELD

The present invention relates to substrate processing apparatuses for processing a substrate and, for example, to a substrate processing apparatus for processing a substrate with laser light or processing a substrate with plasma. In particular, the invention relates to a substrate processing apparatus suitable for use in making color filters on a large-scale glass substrate or restoring color filters made on a large-scale glass substrate.

Also, the invention relates to substrate processing methods for processing a substrate and, for example, to a substrate processing method for processing a substrate with laser light or processing a substrate with plasma. In particular, the invention relates to a substrate processing method suitable for use in making color filters on a large-scale glass substrate or restoring color filters made on a large-scale glass substrate.

BACKGROUND ART

In display devices such as liquid crystal displays and organic EL (electroluminescent) displays, pixels are arrayed in high definition on a large-area substrate. In these display devices, the substrate size has been increasing year by year, and as large substrates as, for example, several meters in one side length are used more and more.

With such substrates, for example, in processing or restoring part of pixels after the making of pixel patterns, there is a need for moving the processing apparatus on the substrate to perform processing or restoration on relevant pixels. For this purpose, substrate alignment needs to be done by accurately rotating a substrate placing table, on which the substrate is placed, so that a moving direction of the processing apparatus and a direction of a pixel of the substrate accurately accord with each other.

One of such substrate alignment methods is described in JP H2-283097 A.

This substrate alignment method includes steps of successively observing two references provided on the substrate by a single camera to measure position data, and determining correction amounts from the observed position data and theoretical position data stored in association with the respective references.

According to this substrate alignment method, substrate alignment can be achieved only by comparing observed position data with the stored theoretical position data. Therefore, the substrate alignment can be carried out quickly.

SUMMARY OF INVENTION

Technical Problem

However, the present inventor found that the conventional method described above is indeed capable of quickly carrying out the substrate alignment, but in some cases becomes unable to achieve correct substrate alignment for the following reasons.

That is, in a case where with pixels arrayed two-dimensionally in an X direction and a Y direction on the substrate, a camera of the processing apparatus is movable in two moving directions (hereinafter, referred to as an X' direction and a Y' direction), the camera being freely movable two-dimensionally according to a sum of a move amount in the X' direction and a move amount in the Y' direction, there are some cases where the X direction coincides with neither the X' direction nor the Y' direction.

Whereas the array directions of pixels, the X direction and the Y direction, are normally perpendicular to each other as shown in FIG. 11, there are some cases where the array directions of pixels, the X direction and the Y direction, are not perpendicular to each other as shown in FIG. 12. In more detail, in the making of high-definition display devices, with one of the camera's moving directions and one of pixels' array directions of the substrate are set accurately coincident with each other (e.g., with the X direction and the X' direction accurately coincident with each other), considerations should be given to the perpendicularity of the X and Y directions as well as the perpendicular of the X' direction and the Y' direction. However, there is a problem that the perpendicularity between the X direction and the Y direction (deviation of pixel pattern) deviates, for example, from mask to mask in the formation of pixel patterns with exposure.

Therefore, when one mask is changed to another, the stored theoretical position data become no longer accurate, make it impossible to achieve an accurate substrate alignment, as a problem.

Solution to Problem

Accordingly, an object of the present invention is to provide a substrate processing apparatus and a substrate processing method which allow the substrate alignment to be achieved accurately and promptly.

In order to achieve the above object, there is provided a substrate processing apparatus comprising:

a substrate placing table having a placing surface for placing a substrate thereon;

a processing section for processing the substrate on the substrate placing surface;

a relative position changing device for changing a relative position of the substrate on the placing surface relative to the processing section;

an image pickup section holding member which is fitted to the substrate placing table so as to be movable in a first direction relative to the placing surface and which has a facing section facing a normal direction of the placing surface and extending along a second direction;

an image pickup section which is fitted to the facing section and which can pick up images of a first marker, a second marker and a third marker formed on the substrate placed on the placing surface;

a storage section which can store a position of the first marker on the substrate and a position of the third marker on the substrate; and a control unit for performing, based on a signal from the image pickup section, first control to make the relative position changing device change the relative position so that a direction of a line connecting the first marker and the second marker accords with the first direction, and for performing, based on a signal from the image pickup section, second control to store positions of the first marker and the third marker in a state that the direction of the line connecting the first marker and the second marker accords with the first direction, and for performing, based on a signal from the image pickup section that has picked up an image of the substrate other than the foregoing substrate of which the positions of the first marker and the third marker have been stored in the storage section, third control to make the relative position changing device change a relative position of the other substrate relative to the processing section so that a direction of a line connecting the first marker and the third marker on the other substrate accords with a direction of a line connecting the first marker and the third marker calculated from the positions of the first marker and the third marker stored in the storage section.

According to this invention, for example, in the case where the substrate, of which the positions of the first marker and the third marker have been stored in the storage section, and the other substrate, are manufactured in one identical lot, i.e. with one identical mask, substrate alignment, for the other substrate, can be accurately achieved only by picking up images of the first marker and the third marker in the image pickup section. Thus, for the other substrate, the substrate alignment can be carried out far more promptly.

In one embodiment of the invention, in the third control, the control unit makes the relative position changing device change the relative position of the other substrate relative to the processing section so that a midpoint of the line connecting the first marker and the third marker on the other substrate accords with a midpoint of a line connecting the first marker and the third marker calculated from the positions of the first marker and the third marker stored in the storage section.

According to this embodiment, a center of the other substrate can be made coincident with a center of the substrate of which the positions of the first marker and the third marker have been stored in the storage section. Thus, the alignment of the other substrate can be carried out easily.

In one embodiment of the invention, the control unit calculates a ratio of a distance between the first marker and the third marker on the other substrate to a distance between the first marker and the third marker calculated from the positions of the first marker and the third marker stored in the storage section.

According to this embodiment, with respect to a substrate serving as a reference for alignment, the degree of expansion or contraction of the substrate (the other substrate) for which alignment is desired can be calculated. Therefore, for the other substrate, substrate alignment can be precisely fulfilled at any temperature.

In one embodiment of the invention, the image pickup section has a first camera and a second camera both immovably fixed to the image pickup section holding member, and a movable camera fitted to the image pickup section holding member so as to be movable in the second direction, and the control unit, in the third control, specifically determines a direction of a line connecting the first marker and the third marker on the other substrate based on a signal from the first camera that has picked up an image of the third marker of the other substrate and a signal from the second camera that has picked up an image of the first marker of the other substrate.

According to this embodiment, cameras (first and second cameras) that pick up an image of the other substrate are not moved to pick up an image of the other substrate. Thus, alignment of the other substrate can be carried out promptly.

In one embodiment of the invention, the image pickup section has a first camera and a second camera both immovably fixed to the image pickup section holding member, and a movable camera fitted to the image pickup section holding member so as to be movable in the second direction, and the control unit, in the first control, specifically determines a direction of a line connecting the first marker and the second marker based on positions of the first marker and the second marker image-picked up by the movable camera and, in the second control, stores in the storage section the positions of the first marker and the second marker image-picked up by the movable camera.

According to this embodiment, the first control and the second control are carried out by image pickup with the movable camera alone. Therefore, the position of the substrate serving as a reference for alignment can be precisely observed, for example, by setting a high sensitivity to the movable camera.

In one embodiment of the invention, a droplet ejecting section for ejecting droplets toward a substrate is mounted on the image pickup section holding member so as to be movable or immovable in the second direction relative to the image pickup section holding member.

According to this embodiment, based on the alignment carried out for the other substrate, droplets can be ejected accurately to desired positions of the other substrate.

Also, there is provided a substrate processing apparatus comprising:

a substrate placing table having a placing surface for placing a substrate thereon;

a processing section for processing the substrate on the placing surface;

a relative position changing device for changing a relative position of the substrate on the placing surface relative to the processing section;

an image pickup section holding member which is fitted to the substrate placing table so as to be movable in a first direction relative to the placing surface and which has a facing section facing a normal direction of the placing surface and extending along a second direction;

an image pickup section which is fitted to the facing section and which can pick up images of a first marker, a second marker, a third marker and a fourth marker formed on the substrate placed on the placing surface;

a storage section which can store a position of the third marker on the substrate and a position of the fourth marker on the substrate; and a control unit for performing, based on a signal from the image pickup section, first control to make the relative position changing device change the relative position so that a direction of a line connecting the first marker and the second marker accords with the first direction, and for performing, based on a signal from the image pickup section, second control to store positions of the third marker and the fourth marker in a state that the direction of the line connecting the first marker and the second marker accords with the first direction, and for performing, based on a signal from the image pickup section that has picked up an image of the substrate other than the foregoing substrate of which the positions of the third marker and the fourth marker have been stored in the storage section, third control to make the relative position changing device change a relative position of the other substrate relative to the processing section so that a direction of a line connecting the third marker and the fourth marker on the other substrate accords with a direction of a line connecting the third marker and the fourth marker calculated from the positions of the third marker and the fourth marker stored in the storage section.

According to this invention, in cases where four or more markers are provided on the substrate, the alignment of the other substrate can be carried out promptly and precisely.

In one embodiment of the invention, in the third control, the control unit makes the relative position changing device change the relative position of the other substrate relative to the processing section so that a midpoint of the line connecting the third marker and the fourth marker on the other substrate accords with a midpoint of a line connecting the third marker and the fourth marker calculated from the positions of the third marker and the fourth marker stored in the storage section.

According to this embodiment, in cases where four or more markers are provided on the substrate, the center of the other substrate can be made coincident with the center of the substrate serving as a reference.

In one embodiment of the invention, the control unit calculates a ratio of a distance between the third marker and the fourth marker on the other substrate to a distance between the third marker and the fourth marker calculated from the positions of the third marker and the fourth marker stored in the storage section.

According to this embodiment, in cases where four or more markers are provided on the substrate, the degree of expansion or contraction of the substrate (the other substrate) for which alignment is desired can be calculated relative to a substrate serving as a reference for alignment. Therefore, for the other substrate, substrate alignment can be precisely fulfilled at any temperature.

In one embodiment of the invention, the image pickup section has a first camera and a second camera both immovably fixed to the image pickup section holding member, and a movable camera fitted to the image pickup section holding member so as to be movable in the second direction, and the control unit, in the third control, specifically determines a direction of a line connecting the third marker and the fourth marker on the other substrate based on a signal from the first camera that has picked up an image of the fourth marker of the other substrate and a signal from the second camera that has picked up an image of the third marker of the other substrate.

According to this embodiment, in cases where four or more markers are provided on the substrate, cameras (first and second cameras) that pick up an image of the other substrate are not moved to pick up an image of the other substrate. Thus, the alignment of the other substrate can be carried out promptly.

In one embodiment of the invention, the image pickup section has a first camera and a second camera both immovably fixed to the image pickup section holding member, and a movable camera fitted to the image pickup section holding member so as to be movable in the second direction, and the control unit, in the first control, specifically determines a direction of a line connecting the first marker and the second marker based on positions of the first marker and the second marker image-picked up by the movable camera and, in the second control, stores in the storage section the positions of the third marker and the fourth marker image-picked up by the movable camera.

According to this embodiment, in cases where four or more markers are provided on the substrate, since the first control and the second control are carried out by the image pickup with the movable camera alone, positions on the substrate serving as an alignment reference can be precisely observed by setting a high sensitivity to the movable camera.

In one embodiment of the invention, a droplet ejecting section for ejecting droplets toward a substrate is mounted on the image pickup section holding member so as to be movable or immovable in the second direction relative to the image pickup section holding member.

According to this embodiment, in cases where four or more markers are provided on the substrate, droplets can be accurately ejected to desired positions on the other substrate based on the alignment carried out for the other substrate.

Also, there is provided a substrate processing method comprising the steps of:

with a first substrate placed on a placing surface of a substrate placing table, making a direction of a line connecting a first marker and a second marker accord with a first direction of an image pickup section holding member which is mounted on the substrate placing table so as to be movable in the first direction relative to the placing surface and which extends along a second direction, based on positions of the first marker and the second marker on the first substrate;

storing a position of the first marker and a position of the third marker on the first substrate in a state that a direction of the line connecting the first marker and the second marker accords with the first direction; and with a second substrate placed on the placing surface of the substrate placing table, making a line connecting the first marker and the third marker on the second substrate accord with a direction of a line connecting the first marker and the third marker on the first substrate calculated based on the position of the first marker and the position of the third marker on the first substrate stored in the storage section.

According to this invention, alignment of the second substrate can be carried out promptly and precisely.

In one embodiment of the invention, the method further comprising the step of:

with the second substrate placed on the placing surface of the substrate placing table, making a midpoint of a line connecting the first marker and the third marker on the second substrate accord with a midpoint of a line connecting the first marker and the third marker on the first substrate calculated based on the position of the first marker and the position of the third marker on the first substrate stored in the storage section.

According to this embodiment, a center of the second substrate can be made-correspondent to a center of the first substrate serving as an alignment reference.

In one embodiment of the invention, the method further comprising the step of:

calculating a ratio of a distance between the first marker and the third marker on the second substrate to a distance between the first marker and the third marker on the first substrate calculated based on the position of the first marker and the position of the third marker on the first substrate stored in the storage section.

According to this embodiment, effects of expansion or contraction of the substrate can be reflected on the alignment.

Also, there is provided a substrate processing method comprising the steps of:

with a first substrate placed on a placing surface of a substrate placing table, making a direction of a line connecting a first marker and a second marker accord with a first direction of an image pickup section holding member which is mounted on the substrate placing table so as to be movable in the first direction relative to the placing surface and which extends along a second direction, based on positions of the first marker and the second marker on the first substrate;

storing a position of a third marker and a position of a fourth marker on the first substrate in a state that a direction of the line connecting the first marker and the second marker accords with the first direction; and with a second substrate placed on the placing surface of the substrate placing table, making a line connecting the third marker and the fourth marker on the second substrate accord with a direction of a line connecting the third marker and the fourth marker on the first substrate calculated based on the position of the third marker and the position of the fourth marker on the first substrate stored in the storage section.

According to this invention, in cases where four or more markers are provided on the substrate, the substrate alignment can be carried out precisely and promptly.

In one embodiment of the invention, the method further comprising the step of:

with the second substrate placed on the placing surface of the substrate placing table, making a midpoint of a line connecting the third marker and the fourth marker on the second substrate accord with a midpoint of a line connecting the third marker and the fourth marker on the first substrate calculated based on the position of the third marker and the position of the fourth marker on the first-substrate stored in the storage section.

According to this embodiment, in cases where four or more markers are provided on the substrate, a center of the second substrate can be made coincident with a center of the first substrate serving as a reference.

In one embodiment of the invention, the method further comprising the step of:

calculating a ratio of a distance between the third marker and the fourth marker on the second substrate to a distance between the third marker and the fourth marker on the first substrate calculated based on the position of the third marker and the position of the fourth marker on the first substrate stored in the storage section.

According to this embodiment, in cases where four or more markers are provided on the substrate, the degrees of expansion or contraction of the second substrate relative to the first substrate serving as a reference can be accurately reflected on the alignment of the second substrate.

Advantageous Effects of Invention

According to the substrate processing method and the substrate processing apparatus of the present invention, the substrate alignment can be carried out accurately and promptly.

DESCRIPTION OF EMBODIMENTS

Hereinbelow, the present invention will be described in detail by way of embodiments thereof illustrated in the accompanying drawings.

First Embodiment

Figure 1:
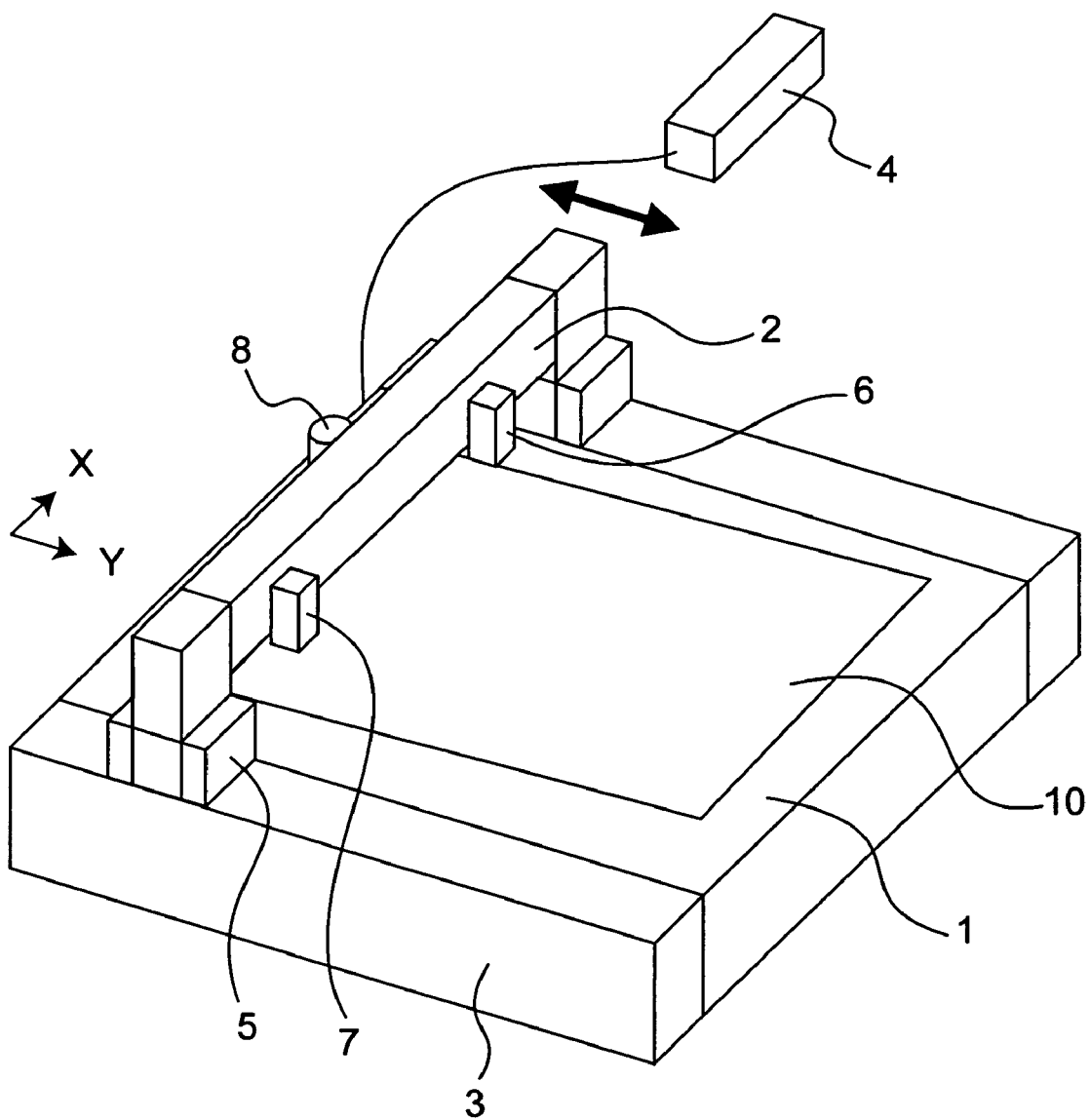
FIG. 1 is a perspective view of a substrate processing apparatus according to a first embodiment of the present invention.

FIG. 1 is a perspective view of a substrate processing apparatus according to a first embodiment of the invention.

This substrate processing apparatus includes a substrate placing table 1, a gantry 2 as an image pickup section holding member, a gantry moving mechanism 3, a levitative moving mechanism 5, a first camera 6, a second camera 7, a movable camera 8, and a microcomputer 4 as a control unit. The first camera 6, the second camera 7 and the movable camera 8 constitute an image pickup section. Also, the microcomputer 4 has a storage section (not shown) for storing information therein.

The substrate placing table 1 has a placing surface for placing a substrate 10 thereon. The placing surface is formed of a granite surface plate (made of granite) having good flatness. The substrate 10 is immovably set onto the placing surface and is releasable from the placing surface. More specifically, the placing surface of the substrate placing table 1 has a plurality of unshown minute holes formed therein, all of the holes being connected to an unshown suction and blower mechanism. Suction and blow control is performed by the control unit, by which the substrate 10 is suctionally set onto the substrate placing table 1 or the substrate 10 suctionally set on the substrate placing table 1 is released.

In the substrate placing table, an unshown θ rotation mechanism is contained. The θ rotation mechanism makes the placing surface of the substrate placing table 1 freely rotate about a center of the placing surface. Thus, the substrate 10 placed on the placing surface can be freely rotated about the center of the placing surface. Although not detailed, the substrate processing apparatus has an unshown vibration isolating mechanism provided on one side of the substrate placing table 1 opposite to its placing surface side, thus enabling vibration damping.

The gantry 2 is formed into an arch type shape. The placing surface is formed into a generally rectangular shape. The gantry 2 is so set as to stretch over the placing surface of the substrate placing table 1 in its one direction. A surface of the gantry 2 opposite to the substrate placing table 1 side is formed into a generally rectangular shape (hereinafter, the direction of the gantry 2 in which the gantry 2 stretches over the substrate placing table 1 (corresponding to a second direction) on a plane of the gantry 2 on one side opposite to its substrate placing table 1 side will be referred to as GanX direction). The levitative moving mechanism 5 is provided two in quantity and set up on the arch-type gantry 2. The levitative moving mechanism 5 keeps normally levitated by air against the gantry moving mechanism 3 so as to be movable in a first direction (hereinafter, referred to as GanY direction). By movement of the levitative moving mechanism 5 in the GanY direction, the gantry 2 is moved in the GanY direction relative to the placing surface. More specifically, the gantry 2 is freely movable in the GanY direction by linear motor control between a magneto linear scale (not shown) on the gantry moving mechanism 3 and the levitative moving mechanism 5.

Set on the gantry 2 are an ink jet head (not shown) as a processing section, the first camera 6, the second camera 7 and the movable camera 8. The ink jet head is enabled to eject ink toward the substrate 10. Based on a signal from the control unit, the ink jet head moves on a lower side face of the gantry 2 properly in the GanX direction so as to eject ink onto the substrate 10 with a proper timing. Since the gantry 2 with the ink jet head mounted thereon is movable in the GanY direction, the ink jet head is so designed as to be freely movable on a two-dimensional plane.

Although the ink jet head is movable in the GanX direction on the gantry in the first embodiment, yet this invention allows the ink jet head to be provided in any construction as far as it can fulfill ejection to any arbitrary position in the GanX direction in an ejection target region of the substrate. It is also allowable, for example, that with a plurality of fixedly set ink jet heads placed in array, ink jet heads to be used for ejection are selected as required, or that long ink jet heads fixedly set so as to cover an ejection-target region may be used.

A position of the processing section relative to the substrate 10 suctionally set on the placing surface is freely movable in a three-dimensional space. That is, in this embodiment, as described above, the substrate placing table 1 is θ-rotatable about a center of the substrate placing table 1, and moreover the ink jet head serving as a processing section is freely movable on a two-dimensional plane. In this case, the two-dimensional plane on which the substrate placing table 1 moves and the two-dimensional plane on which the ink jet head moves are parallel to each other. As a result, the position of the processing section relative to the substrate 10 suctionally fixed to the substrate placing table 1 is movable in a three-dimensional space. The θ-rotation mechanism and the gantry 2 constitute a relative position changing device.

Although the substrate placing table 1 makes θ-rotation and the ink jet head as the processing section freely move on the X-Y plane in this embodiment, yet it is also allowable for the invention that the substrate placing table makes θ-rotation and is freely movable on the X-Y plane, and moreover the processing section (e.g., ink jet head) is freely movable on the X-Y plane. In this invention, it is also allowable that the relative position of the processing section to the substrate suctionally fixed to the substrate placing table is freely changed by moving only the processing section on a two-dimensional space without moving the substrate placing table. It is further allowable in this invention that the relative position of the processing section to the substrate suctionally fixed to the substrate placing table is freely changed by moving only the substrate placing table on the two-dimensional space without moving the processing section.

The first camera 6, the second camera 7 and the movable camera 8 perform observation of the substrate. The first camera 6 and the second camera 7 are fixedly set on the gantry 2 to observe the substrate 10 and pick up images thereof. Images of the substrate 10 observed and picked up by the first camera 6 and the second camera 7 are sent to the microcomputer 4. On the other hand, the movable camera 8, which is set so as to be movable on the gantry 2 in the GanX direction, observes the substrate 10 and picks up images thereof. Since the gantry 2 with the movable camera 8 mounted thereon is movable in the GanY direction, the movable camera 8 is freely movable on a two-dimensional plane. An image of the substrate 10 observed and picked up by the movable camera 8 is sent to the microcomputer 4.

The microcomputer 4 performs movement control for the gantry 2, movement control for the movable camera 8 on the gantry 2, ejection control for the ink jet head on the gantry 2, rotation control for the substrate placing table 1, and analysis of images derived from the cameras 6, 7, 8.

Observation positions of the first camera 6 and the second camera 7 and a droplet ejection position of the ink jet head are preliminarily measured and adjusted after the mounting of the ink jet head.

A nozzle plate is bonded to a surface of the ink jet parallel to the placing surface of the substrate placing table 1. The nozzle plate has a plurality of nozzle holes. The nozzle holes are set to a diameter of 10 to 20 μm. The ink jet used in this case is one in which recesses serving as a plurality of ink chambers are formed in a piezoelectric-material substrate. In this ink jet, with electrodes formed in part of its partition wall side faces, an electric field is applied between both side faces of the partition wall to make the partition wall itself shear-deformed so that ejection energy is generated.

A distance between a droplet ejecting surface, which is a lowermost surface of the nozzle plate of the ink jet head, and an upper surface of the substrate 10 is previously set to 0.5 to 1 mm under a condition that the substrate 10 is placed on the substrate placing table 1. This device is so designed as to eject ink along with movement of the gantry 2 in the GanY direction. When the ink jet head ejects a droplet toward the substrate 10 on the substrate placing table 1, the substrate 10 is accurately fixed to the substrate placing table 1. The gantry 2 may be skewed from an original state because of a subtle difference between moving speeds of the two levitative moving mechanisms (deviation of gantry). Although this deviation hardly varies, a variation, if it occurs, would require a correction of the ejection position as described later.

The substrate 10 is a large-scale glass substrate. That is, the substrate processing apparatus of the first embodiment is designed to process large-scale glass substrates. It is needless to say that substrates that can be processed by this invention are not limited to large-scale glass substrates, and also needless to say, material, size or thickness of the substrate processed by this invention is not limitative.

Figure 11:
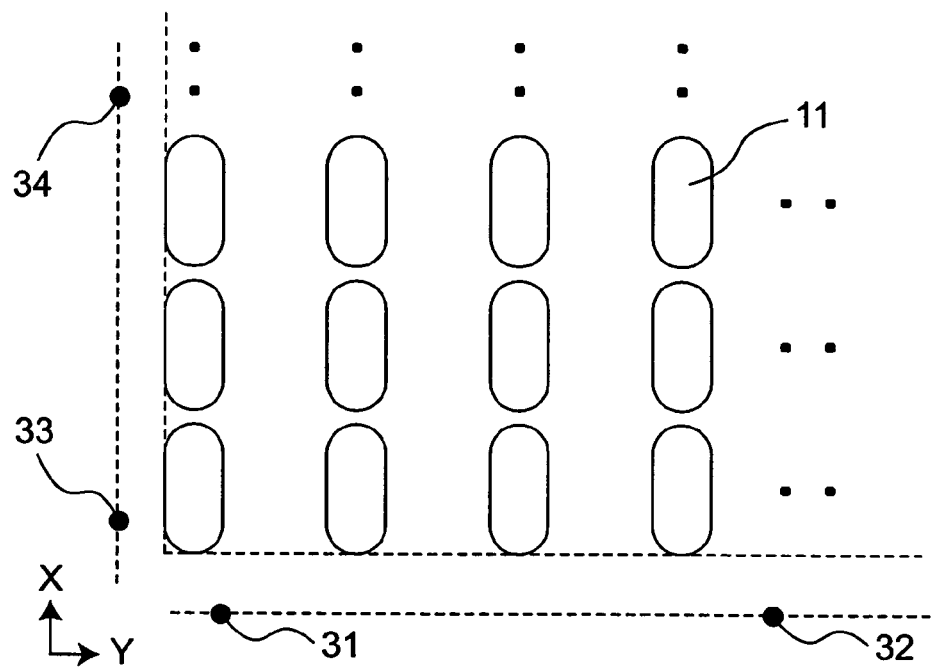
FIG. 11 is a view showing a plurality of pixels of which one array direction, the X direction, and the other array direction, the Y direction, are perpendicular to each other.

In the substrate 10, a plurality of areas 11 for receiving droplets are regularly arrayed as shown in FIG. 11. That is, regular substrate patterns are formed. The areas 11 having the regularity are formed from resin. However, the areas of regularity on the upper surface of the substrate may also be formed from metal or glass material. The areas 11 have liquid repellence to application liquids.

Figure 12:
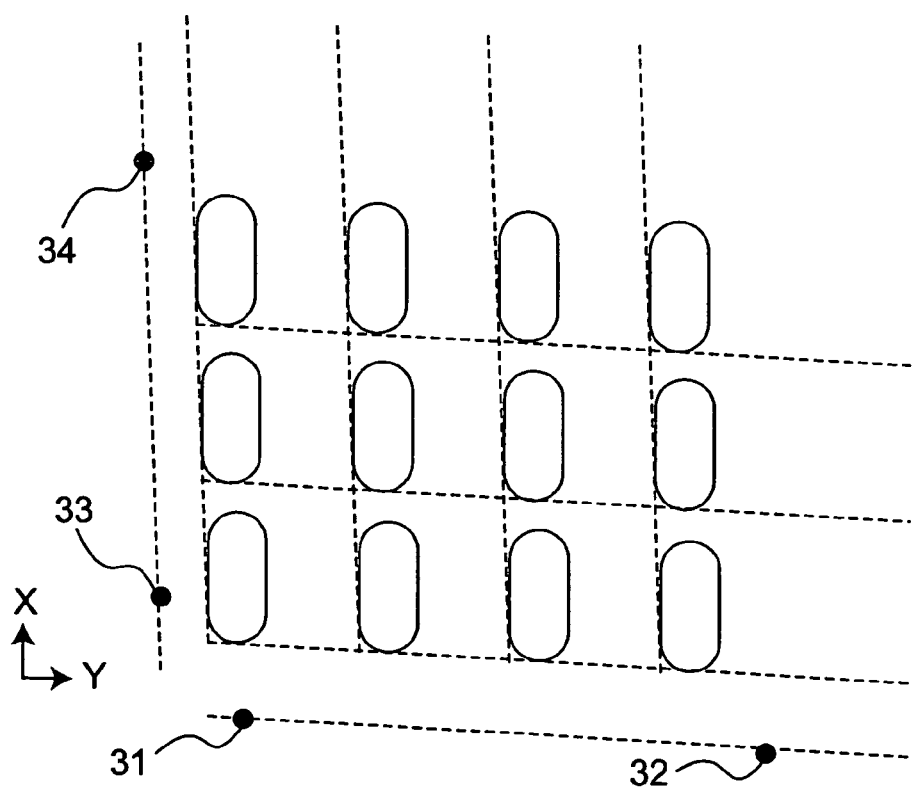
FIG. 12 is a view showing a plurality of pixels of which one array direction, the X direction, and the other array direction, the Y direction, are not perpendicular to each other.

As described above with reference to FIG. 12, a substrate pattern may be dislocated from an ideal one due to errors in pattern formation (errors occurring from mask setting, substrate setting, optical system etc.), or errors of the mask itself. That is, unlike FIG. 11, there are some cases where one direction and the other of the array of substrate patterns are not perpendicular to each other as shown in FIG. 12.

Figure 2:
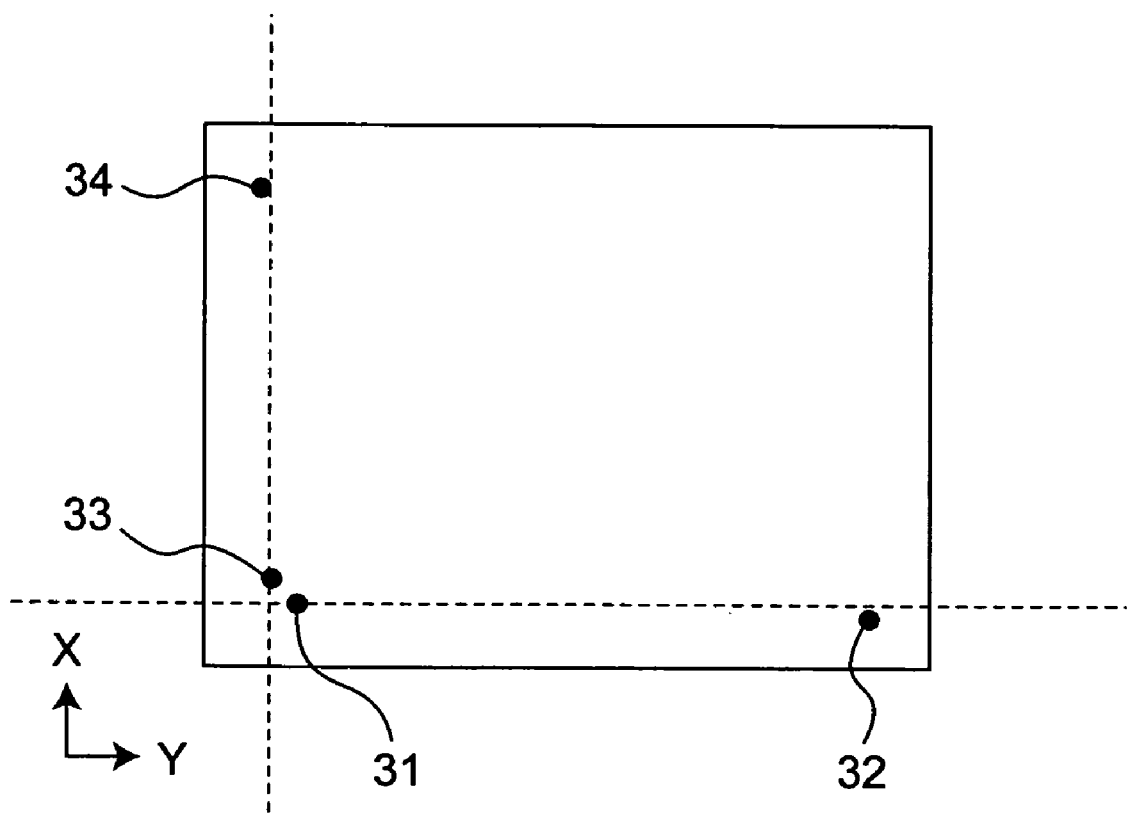
FIG. 2 is a view showing an upper face of a substrate on one side opposite to its substrate placing table side.

FIG. 2 is a view showing an upper face of the substrate 10 on one side opposite to its substrate placing table 1 side.

As shown in FIG. 2, four markers, i.e. first to fourth markers 31, 32, 33, 34 are formed on the upper face of the substrate 10. The first to fourth markers 31, 32, 33, 34, serving as references of substrate alignment, are formed on the substrate 10 simultaneously and integrally with substrate patterns in the formation of the substrate patterns by the same process as that of the substrate patterns (array of the areas 11). Since the first to fourth markers 31, 32, 33, 34 are formed integrally with the substrate patterns, relative positions of the markers 31, 32, 33, 34 to the substrate patterns are constant at all times among a plurality of substrates under a condition of the same temperature. Of course, the relative positions of the markers 31, 32, 33, 34 to the substrate patterns are affected by contraction of the substrate 10 or expansion of the substrate 10 due to temperature changes.

A direction connecting the first marker 31 and the second marker 32 defines one direction of the substrate 10, this direction hereinbelow being parallel to one direction (assumed as Y direction) of the substrate patterns. On the other hand, a direction connecting the third marker 33 and the fourth marker 34 defines the other direction of the substrate 10, this direction being parallel to the other direction (assumed as X direction) of the substrate patterns.

An angle formed by a line connecting the first marker 31 and the second marker 32 and a line connecting the third marker 33 and the fourth marker 34 is not necessarily 90 degrees (not necessarily perpendicular) depending on errors of marker formation. Occurrence of errors are due to the same reasons as those in case of the substrate patterns as described above.

The angle formed by the line connecting the first marker 31 and the second marker 32 and the line connecting the third marker 33 and the fourth marker 34 is not necessarily coincident with an angle of the apparatus coordinate system, i.e., an angle formed by GanX and GanY. In other words, the angle formed by the line connecting the first marker 31 and the second marker 32 and the line connecting the third marker 33 and the fourth marker 34 is not equal to an angle formed by the gantry's moving direction and the gantry's extending direction.

It is needless to say that the set positions of the markers 31, 32, 33, 34 are not limited to end portions (see FIG. 2) of the substrate 10. Although the markers are preferably set at end portions of the substrate, yet the first to fourth markers may be set at any places on the substrate only if the direction connecting the first marker and the second marker is parallel to the Y direction of the substrate patterns and moreover the direction connecting the third marker and the fourth marker is parallel to the X direction. Further, the markers do not needed to be four in number, and the role of a plurality of markers may be fulfilled by one marker. For example, the marker 31 and the marker 33 may be given by one marker.

Even with occurrence of at least either one of pattern deviation and gantry deviation, the ink has to be applied accurately to a target position. Therefore, the alignment of the substrate 10, i.e. position adjustment of the substrate 10, has to be done. More specifically, the alignment of the substrate 10 has to be performed under the following six conditions ((1)-(6)).

(1) Perpendicularity between the gantry 2 and the substrate placing table 1 is unknown. (2) Linearity of the gantry 2 holds (the GanX direction and the GanY direction are each along one direction). (3) Linearity of the substrate placing table 1 holds (the X direction and the Y direction are each along one direction). (4) Perpendicularity of the substrate patterns (array of cells (area 11)) is unknown. (5) Perpendicularity of the substrate patterns (cell array) does not change at least with the lot unchanged (with the mask unchanged). (6) Linearity of the substrate patterns (cell array) holds.

Under these conditions, the substrate processing apparatus of the first embodiment achieves the alignment of the substrate 10 more accurately and promptly, as compared with the apparatus described in the prior art, as shown below. In the first embodiment, this is fulfilled by executing two steps of operations, i.e., a calibration operation on the substrate 10 and an alignment operation on the substrate 10.

The alignment of the substrate 10 in the first embodiment is explained below.

An unshown transfer robot places the substrate 10 on the substrate placing table 1. This is carried out by, with reference to FIG. 1, preliminarily positioning the gantry 2 to the left end on the left side in the figure, then placing the substrate 10 onto the substrate placing table 1 from the right side of the figure. The placed substrate 10 is immediately air sucked to the substrate placing table 1 so as to be fixed to the substrate placing table 1. More specifically, a plurality of through holes are formed in the substrate placing table 1, and a device for sucking and blowing air is connected to openings of the through holes on one side opposite to the placing surface side. After the substrate 10 is placed on the placing surface of the substrate placing table 1, air in the through holes is sucked so that the substrate 10 is sucked up to the placing surface. While the substrate 10 is placed and sucked to the substrate placing table 1, no alignment work, whichever it is, is carried out. That is, at a time point of placement of the substrate 10, the substrate 10 is positioned on the substrate placing table 1 with a machine accuracy for a desired placement position of the substrate 10.

Figure 3:
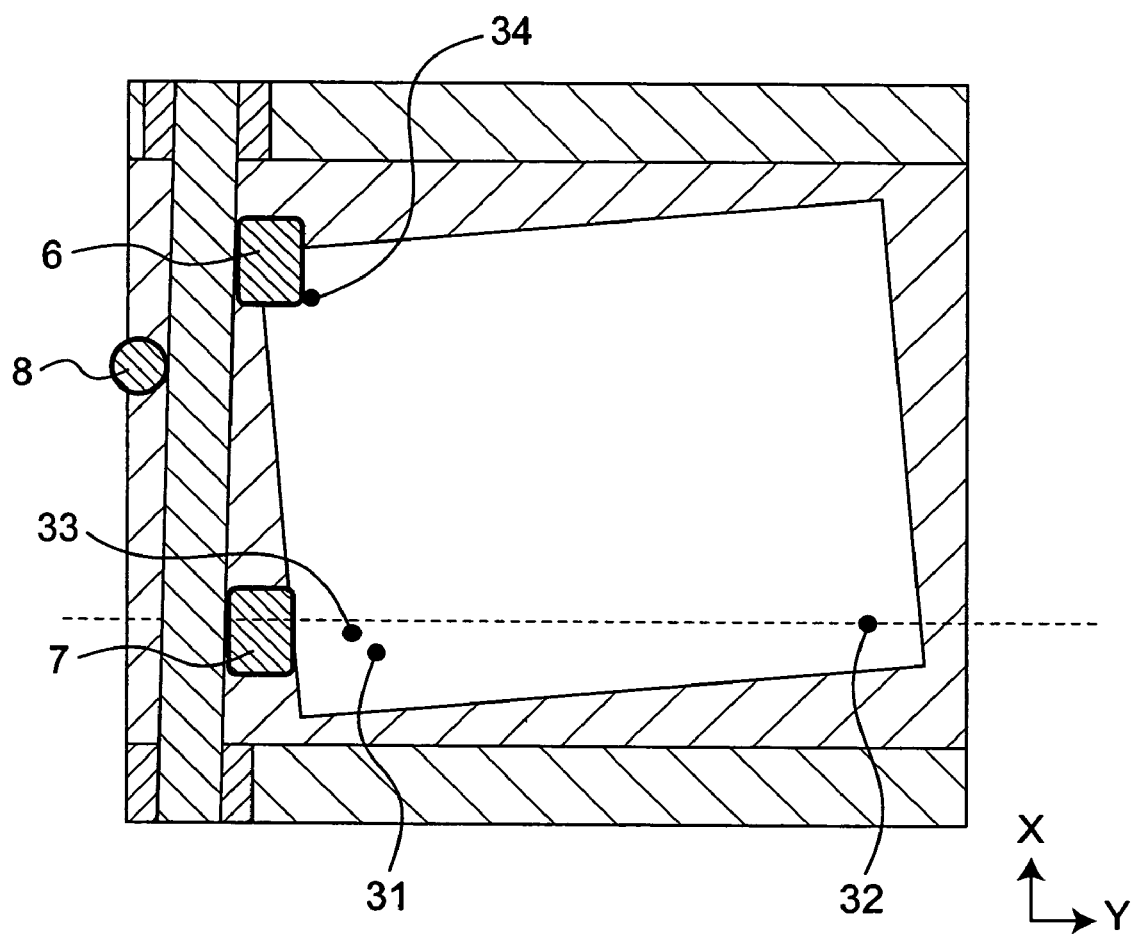
FIG. 3 is a view showing an example of a relationship between the substrate and the substrate placing table immediately after the substrate is placed on the substrate placing table.

FIG. 3 is a view showing an example of a positional relationship between the substrate 10 and the substrate placing table 1 immediately after the substrate 10 is placed on the substrate placing table 1. It is to be noted that although the markers 31, 32, 33, 34 may be positioned at invisible places hidden by the gantry 2 or the cameras 6, 7, 8 in FIGS. 3 through 10, yet the positions of the markers 31, 32, 33, 34 are always shown for explanation's sake. As shown in FIG. 3, the substrate 10, for placement onto the substrate placing table 1, is placed so as to be shifted in the XY direction and the θ direction relative to a desired placement position.

Next, a calibration operation is carried out. In the calibration operation, with respect to one of plural substrates 10 of one identical lot, i.e. made with one identical mask, positions of the first to fourth markers 31, 32, 33, 34 are stored in the control unit as shown below.

Figure 4:
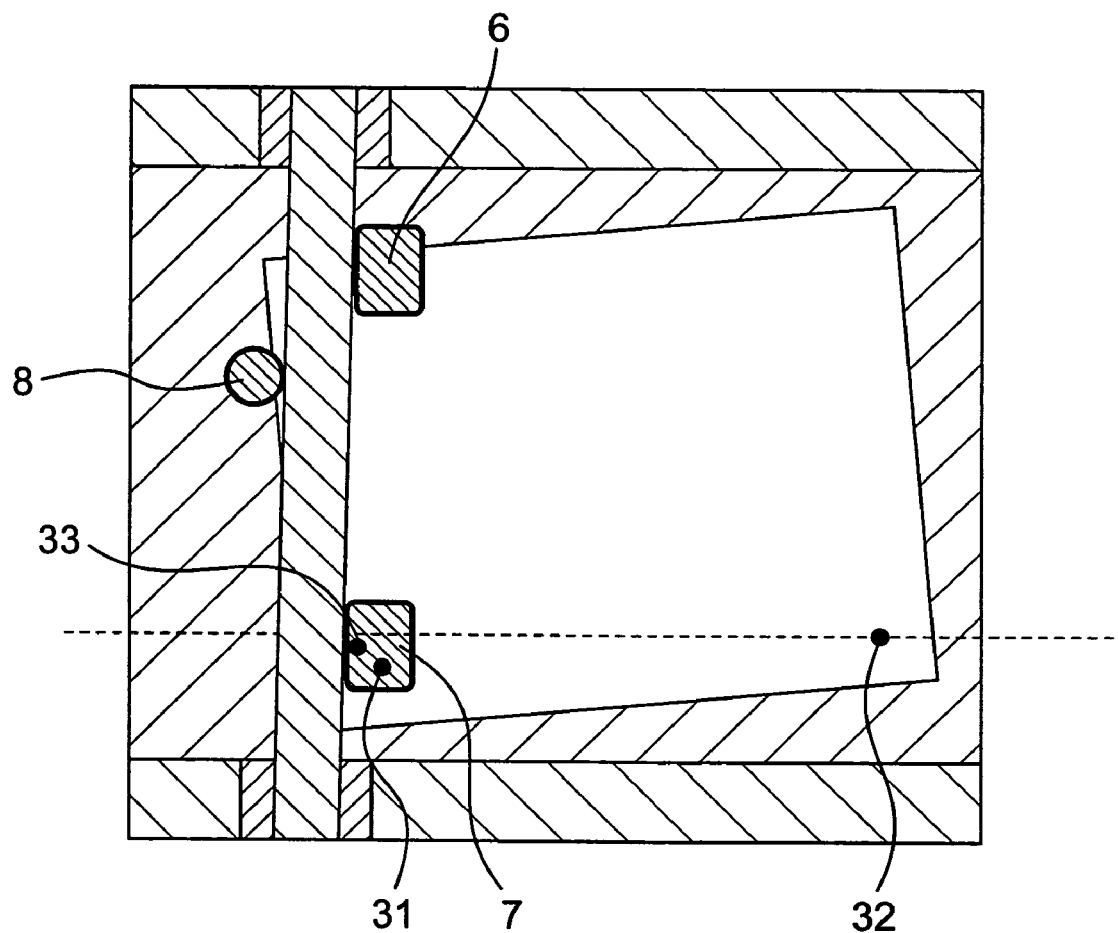
FIG. 4 is a view showing a second camera under observation of a first marker.
Figure 5:
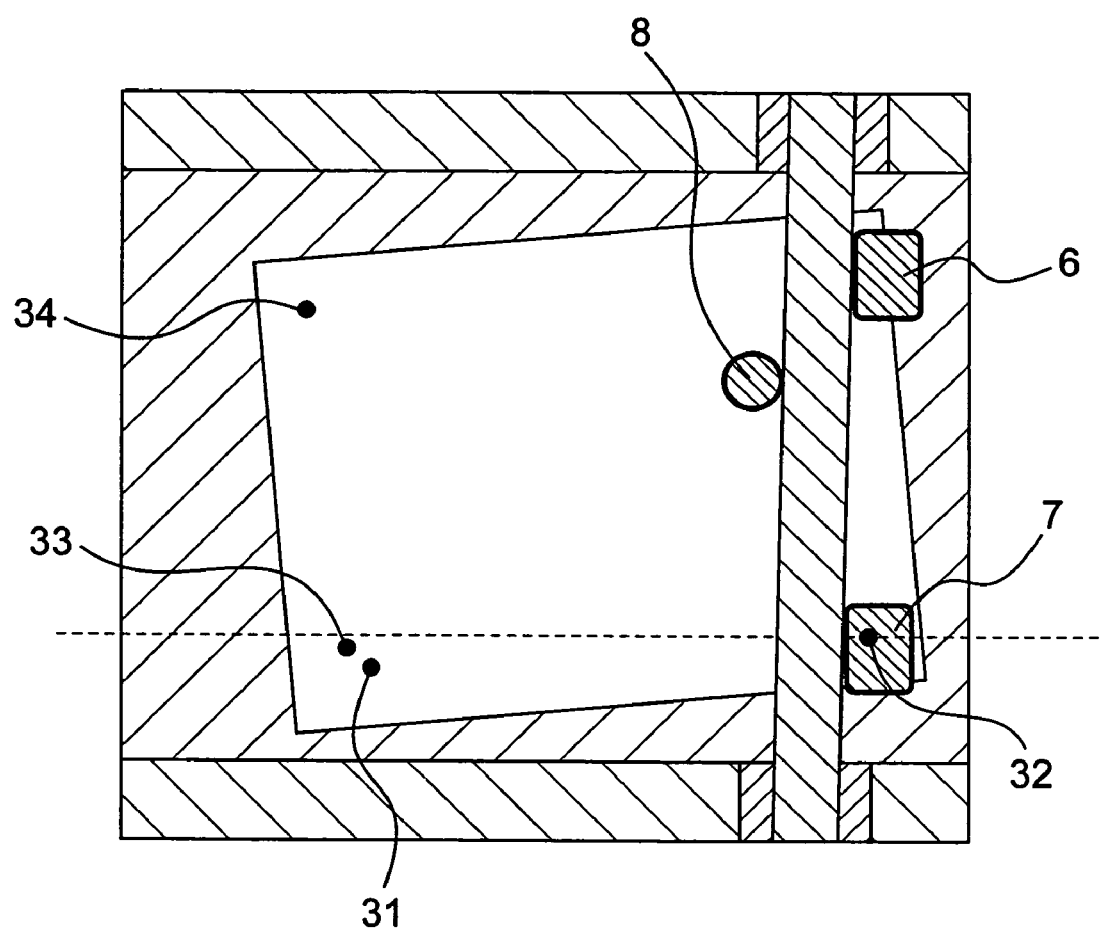
FIG. 5 is a view showing a second camera that has found and is observing the second marker.

First, as shown in FIG. 4, the first marker 31 is observed by using the second camera 7, and an observed image is transmitted to the control unit so that the position is read. Next, while the gantry 2 is being moved, the substrate 10 is observed by the second camera 7 to look for the second marker 32 by the second camera 7. As shown in FIG. 5, the second marker 32 is found and observed by the second camera 7, and an observed image is transmitted to the control unit so that the position is read.

Thereafter, the control unit calculates the positions of the first marker 31 and the second marker 32 to determine a deviation amount of the substrate 10 in the θ direction (i.e., a θ deviation amount between the direction of a line connecting the first marker 31 and the second marker 32 and the GanY direction).

Figure 6:
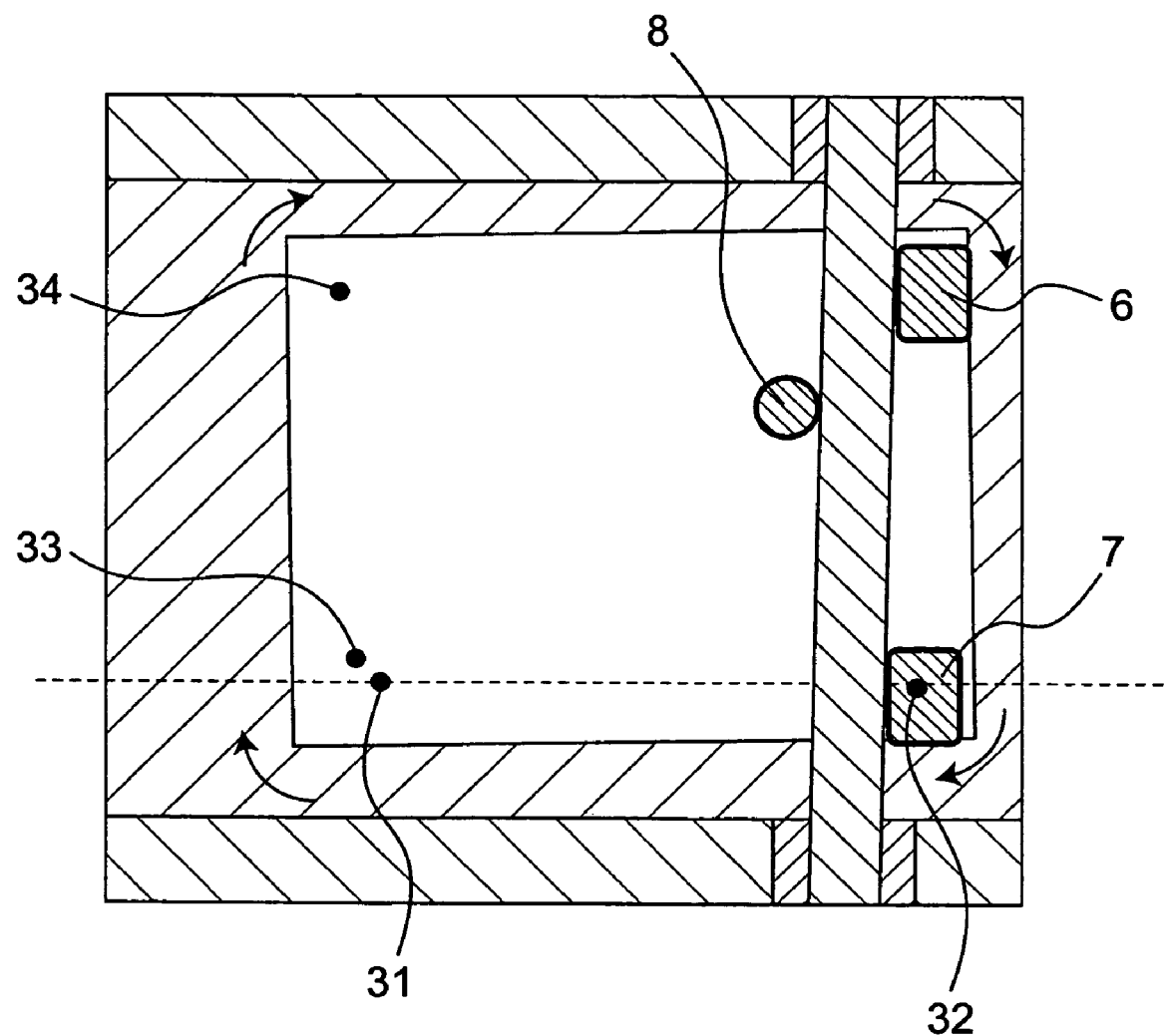
FIG. 6 is a view showing a state that a line connecting the first marker and the second marker accords with a GanY direction.
Figure 7:
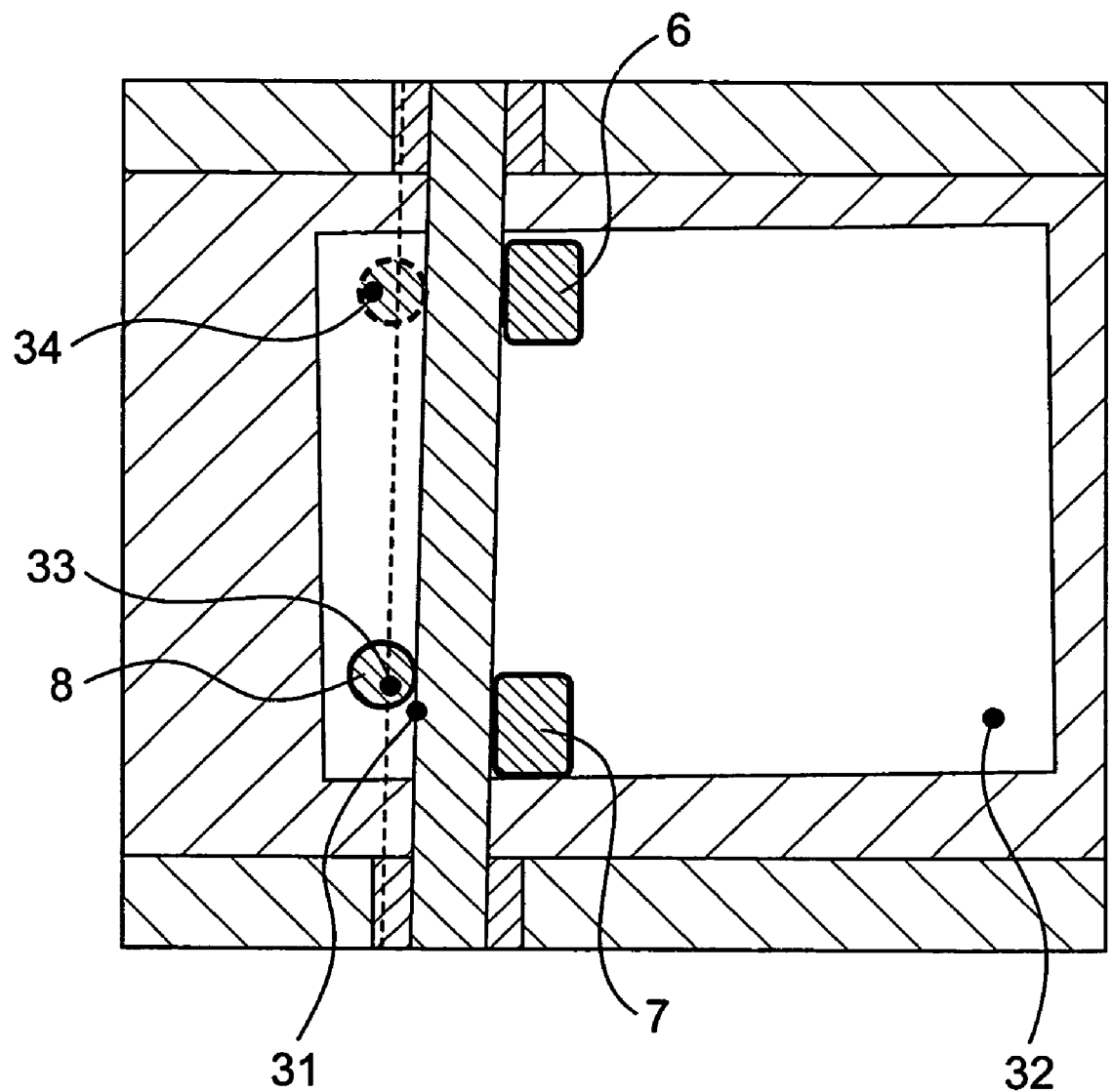
FIG. 7 is a view showing, in broken line, a movable camera that has found and is observing a fourth marker.

The substrate 10 is rotated by the O-direction deviation amount determined by the control unit so that the first marker 31 and the second marker 32 accord with each other in the GanY direction as shown in FIG. 6. Based on the positions of the first marker 31 and the second marker 32, a position of the third marker 33 is approximated (approximately calculated from design-based positional relationships among the first marker 31, the second marker 32 and the third marker 33). The gantry 2 and the movable camera 8 are properly moved, by which the movable camera 8 is moved to the approximated position. Then, the third marker 33 is observed and image-picked up by the movable camera 8, and the picked-up image is sent to the control unit, where the position of the third marker 33 is read.

Subsequently, while the movable camera 8 is being moved in the GanX direction, the substrate 10 is observed by the movable camera 8 to search for the fourth marker 34 by the movable camera 8. Then, at a position of the movable camera 8 shown by broken line in FIG. 7, the fourth marker 34 is found and observed by the movable camera 8, and an observed image is transmitted to the control unit so that the position of the fourth marker 34 is read.

Based on the positions of the third marker 33 and the fourth marker 34, a skew of the line connecting the third marker 33 and the fourth marker 34 (X direction of substrate patterns) relative to the GanX direction is determined, by which a gradient correction of the gantry 2 is performed. For example, if the distance between the third marker 33 and the fourth marker 34 is +1000 mm in the GanX direction and +1 mm in the GanY direction, then the gradient of gantry 2 is corrected so as to be +1000 in GanX direction to +1 in GanY direction. Besides, for correction of substrate expansion, which will be described below, a position of a midpoint between the third marker 33 and the fourth marker 34 as well as a distance (assumed as L0) between the third marker 33 and the fourth marker 34 are determined and stored in the storage section.

As in the first embodiment, picking up images of the third marker 33 and the fourth marker 34 by using the movable camera 8 makes it possible to measure the distance between the third marker 33 and the fourth marker 34 with high accuracy, as compared with the case in which the third marker and the fourth marker are image-picked up by different two immovable cameras.

The gantry 2 is moved, and the third marker 33 is observed by the second camera 7 and moreover the fourth marker 34 is observed by the first camera. Then, positions of the third marker 33 and the fourth marker 34 are stored in the storage section of the microcomputer 4. These stored positions are taken as reference positions for the succeeding alignment.

In addition, although the movable camera 8 is used in the first embodiment, it is also allowable that with the movable camera omitted, two immovable cameras are used to observe the third and fourth markers, or that a positional relationship between the third and fourth markers are determined from coordinates of the first camera and the second camera. In this case, since the movable camera becomes unnecessary, the manufacturing cost of the substrate processing apparatus can be cut down.

The first and second markers, the third marker, and the fourth marker may be observed by different three immovable cameras. In this case, the first and second markers are image-picked up by the first camera, the third marker is image-picked up by the second camera, and the fourth marker is observed by the third camera. In this case, needless to say, the degree of freedom of placement positions for the first to fourth markers can be improved, as compared with the case in which the first to fourth four markers are image-picked up by two immovable cameras.

Next, the alignment operation of the substrate is explained.

First, a substrate 10 which is other than the substrate used for calibration but which belongs to the same lot as that of the substrate is placed on the placing surface of the substrate placing table 1 by the transfer robot. At this point, as described above, the position of the substrate 10 is deviated from a correct position in the XY direction and the θ direction.

Figure 9:
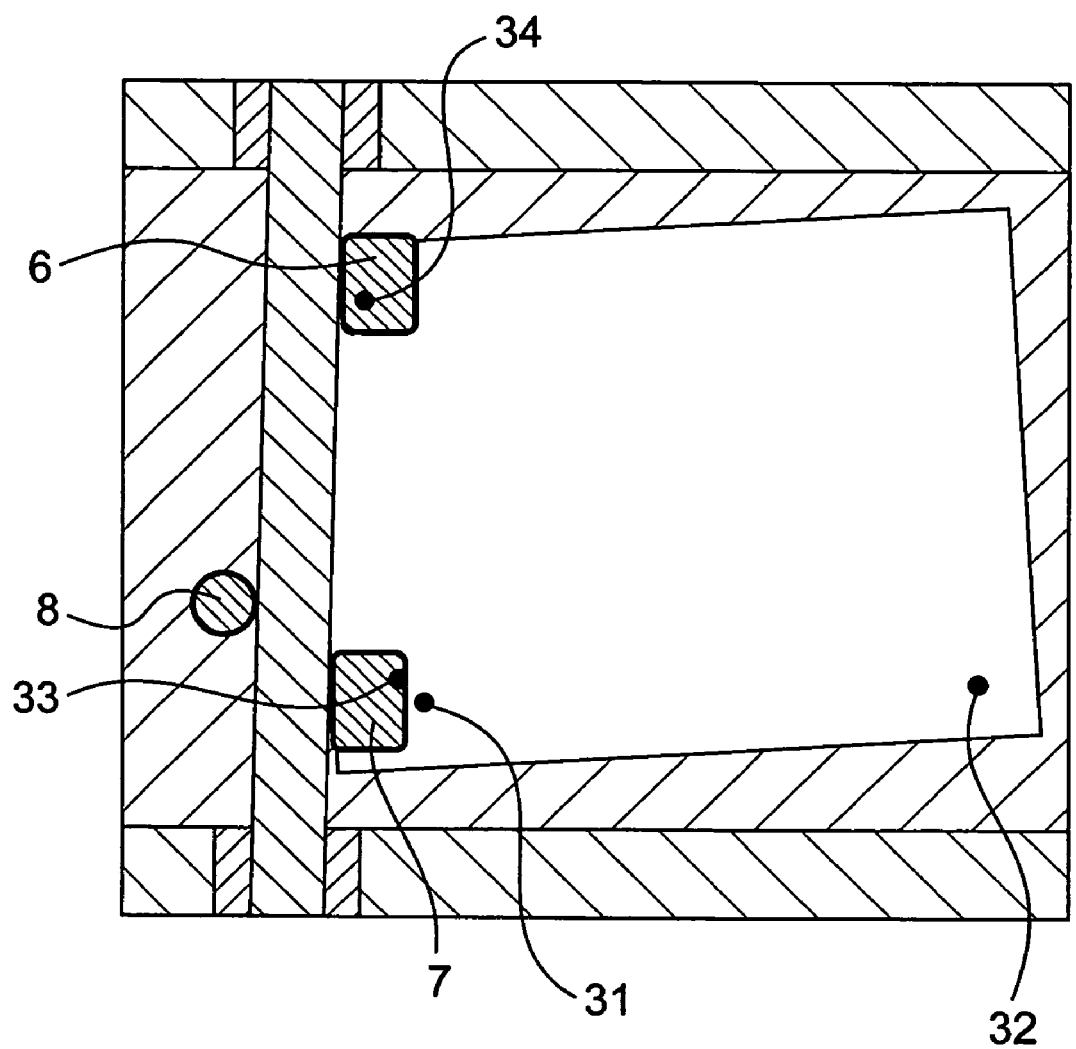
FIG. 9 is a view showing a state under observation of the fourth marker by a first camera and observation of a third marker by the second camera.

Next, the third marker 33 and the fourth marker 34 are observed by using the first camera 6 and the second camera 7. As required, the gantry 2 is moved so that the third marker 33 and the fourth marker 34 can be observed simultaneously as shown in FIG. 9. This movement is only for enabling simultaneous observation, requiring a short distance of movement of the gantry.

Figure 10:
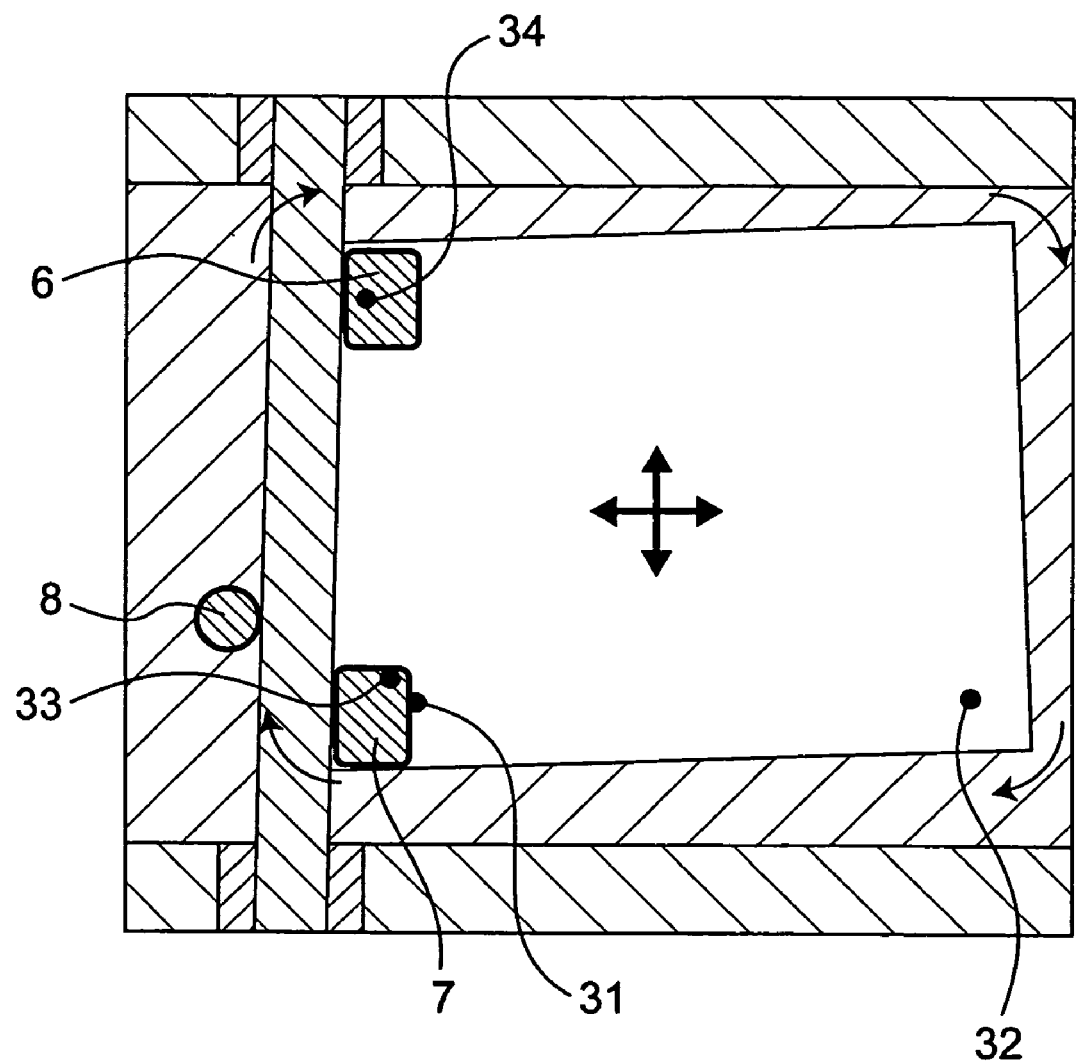
FIG. 10 is a view showing a substrate placing table that has moved in X, Y and θ directions so as to correspond to a positional relationship learned by calibration.

A difference between the distance from the third marker 33 to the fourth marker 34 read by the calibration operation and the distance obtained this time is regarded as a substrate expansion. Also, as shown in FIG. 10, the substrate placing table 1 is moved in the θ direction and the gantry 2 is moved in the XY direction so that the third marker 33 and the fourth marker 34 correspond to the positional relationship read by the calibration.

Figure 8:
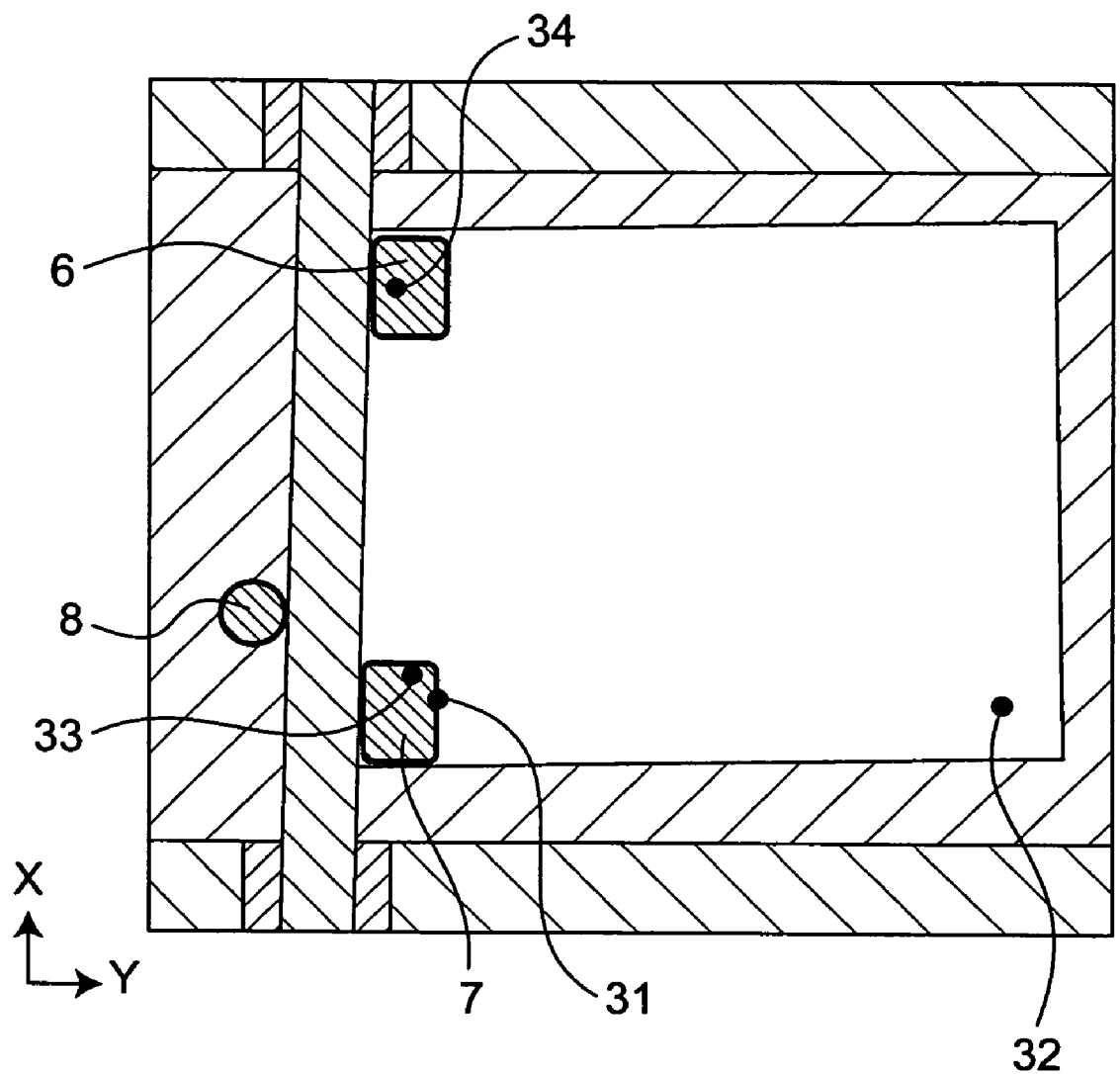
FIG. 8 is a view showing a position of the substrate stored by calibration operation.

For example, the substrate placing table 1 is θ-rotated so that the angle formed by the line connecting the third marker 33 and the fourth marker 34 becomes equal to the angle read in FIG. 8, i.e. the angle read by the calibration operation. Subsequent to this, the gantry 2 is moved in the XY direction so that a position of the midpoint between the third marker 33 and the fourth marker 34 becomes coincident with the position of the midpoint between the third marker 33 and the fourth marker 34 read by FIG. 8. As a result, even when substrate expansion is involved, the first marker 31 and the second marker 32 accord with the gantry's moving direction.

The substrate 10 used in the calibration operation and the substrate 10 used in the substrate alignment operation are made with the same mask (same lot), the GanY direction and the Y direction of the substrate patterns become coincident with each other in the substrate 10 at this time point.

Further, a correction of expansion of the substrate 10 is carried out as described below. In the alignment operation, a distance (assumed as L1) between the third marker 33 and the fourth marker 34 is determined. A ratio of L1/L0 (=α), i.e., a ratio of the distance L1 to the distance L0 determined in the calibration operation between the third marker 33 and the fourth marker 34 is taken as a correction value for the substrate expansion. For example, if design distances of a target ejection position from the references are (XA, YA), then a position corresponding to (α·XA, α·YA) is taken as a target ejection position after the substrate expansion correction.

According to the first embodiment, in the alignment operation of the substrate 10, the gantry is almost never moved and moreover the GanY direction and the Y direction of the substrate patterns can be made coincident with each other without using the movable camera 8. Thus, the substrate alignment can be carried out far more promptly and easily, as compared with the case in which positions of the four markers are observed every time. Moreover, the substrate expansion correction can be carried out with simplicity, and the substrate alignment can be carried out with precision.

The invention of the first embodiment is so designed as to eject ink accurately to a desired position of the substrate 10 after execution of the substrate alignment. Now this operation is explained below.

FIGS. 13A-13D are schematic views showing relationships between patterns 81, 82, 83 on the substrate and nozzles 84, 85, 86 of the ink jet head under progress of an ink ejecting operation by the droplet ejecting section.

In FIGS. 13A to 13D, description is made on a case in which the patterns 81, 82, 83 and the nozzles 84, 85, 86 are provided each three in number for simplicity's sake. However, of course, the ink may be ejected to many patterns by four or more nozzles. Also of course, the ink may be ejected to many patterns by properly moving one or two nozzles in the GanX direction. Although not shown, ejecting surfaces of the nozzles 84, 85, 86 and the substrate placing surface of the substrate placing table are parallel to each other. Also, distances between the placing surface of the substrate placing table and the ejecting surfaces are kept normally constant regardless of the position of the gantry. In this example, it is assumed that the GanY direction, which is the gantry's moving direction, and the Y direction of the patterns 81, 82, 83 are coincident with each other, and that the X direction of the patterns 81, 82, 83 is skewed relative to the GanX direction, which is the gantry's extending direction. It is also assumed that the nozzles 84, 85, 86 are positioned collinear on a line extending along the GanX direction.

By the substrate alignment operation described above, the GanY direction, which is the gantry's moving direction, and the Y direction of the substrate patterns accord with each other.

Figure 13A:
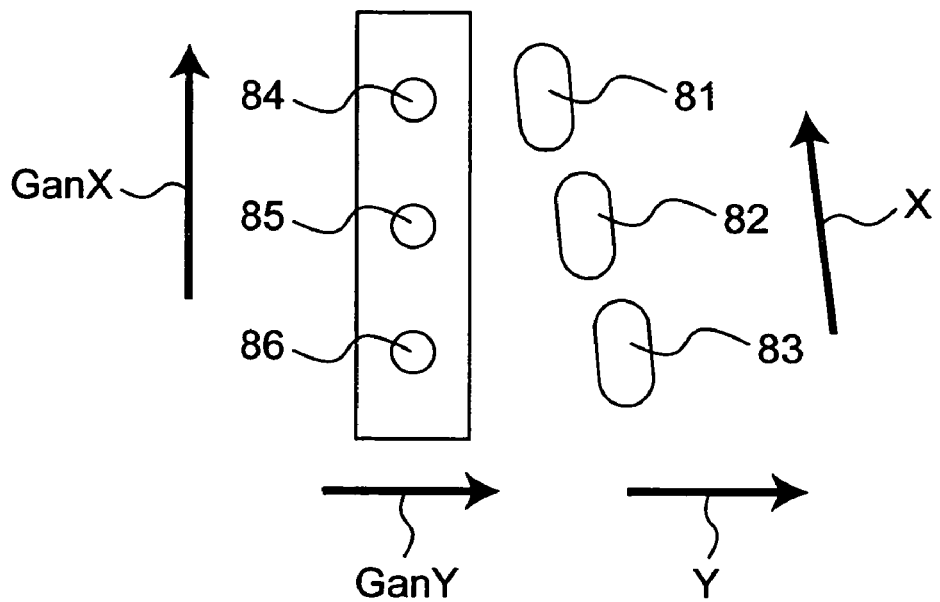
FIG. 13A is a schematic view showing a relationship between patterns on the substrate and nozzles under progress of an ink jet operation.

The gantry 2 is moved in the GanY direction shown by arrow in FIG. 13A, and the nozzles 84, 85, 86 are moved also in the GanY direction.

Figure 13B:
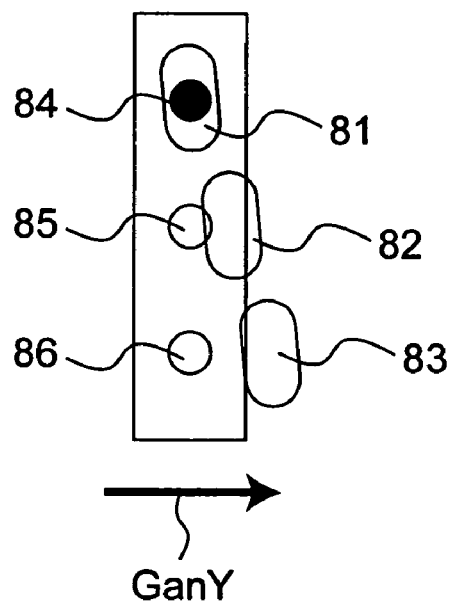
FIG. 13B is a schematic view showing a relationship between patterns on the substrate and the nozzles under progress of an ink jet operation.

When a first nozzle 84 has arrived on a first pattern 81, the control unit transmits a signal to the ink jet head so that ink is ejected from the first nozzle 84. As a result, as shown in FIG. 13B, the first nozzle 84 ejects ink to the first pattern 81.

Figure 13C:
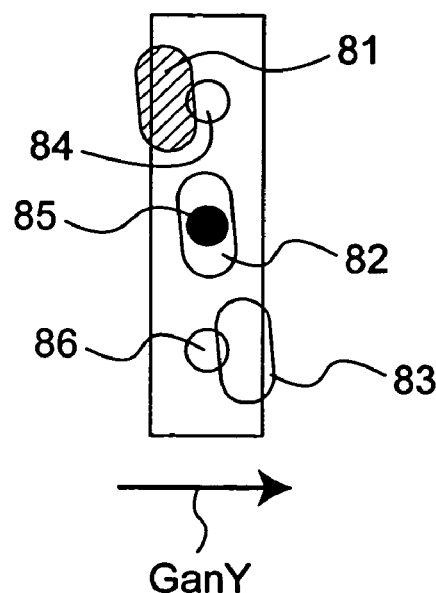
FIG. 13C is a schematic view showing a relationship between patterns on the substrate and the nozzles under progress of an ink jet operation.

Next, with the gantry moved further in the GanY direction, when a second nozzle 85 has arrived on a second pattern 82, the control unit transmits a signal to the ink jet head so that ink is ejected from the second nozzle 85. As a result, as shown in FIG. 13C, the second nozzle 85 ejects ink to the second pattern 82.

Figure 13D:
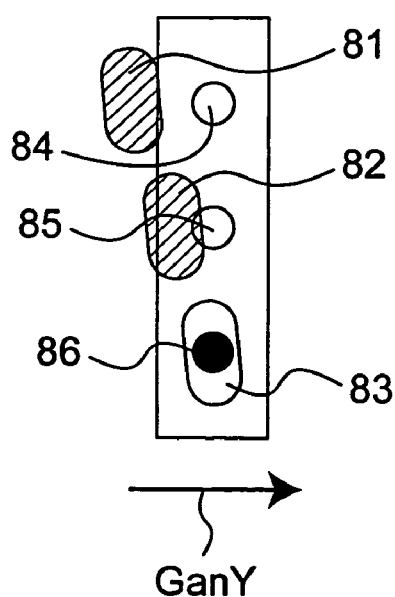
FIG. 13D is a schematic view showing a relationship between patterns on the substrate and the nozzles under progress of an ink jet operation.

Subsequently, with the gantry moved further in the GanY direction, when a third nozzle 86 has arrived on a third pattern 83, the control unit transmits a signal to the ink jet head so that ink is ejected from the third nozzle 86. As a result, as shown in FIG. 13D, the third nozzle 86 ejects ink to the third pattern 83.

As shown above, if the pattern's Y-axis direction and the gantry's moving direction (GanY direction) are coincident with each other and if a skew angle between the pattern's X-axis direction and the gantry's extending direction (GanX direction) is known, then the droplet can be ejected to an accurate position only by correcting the timing of ejection.

According to the substrate processing apparatus of the first embodiment, in the substrate alignment operation, a position of the substrate 10 relative to the substrate placing table can be precisely determined only by making the direction of the fourth marker 34 relative to the third marker 33 accord with the direction of the fourth marker 34 relative to the third marker 33 stored in the control unit by the substrate calibration operation and by making a midpoint of the third marker 33 and the fourth marker 34 accord with the midpoint of the third marker 33 and the fourth marker 34 stored in the control unit by the substrate calibration operation, so that the substrate alignment can be accurately achieved for the second and following substrates 10 of one identical lot without looking up for the first and second markers 31, 32 that specifically determine the Y direction. Therefore, substrate alignment can be fulfilled far more promptly, as compared with conventional apparatuses that need observations in the X direction and the Y direction for all the substrates.

Also according to the substrate processing apparatus of the first embodiment, in the substrate alignment operation, the degree of expansion or contraction of the substrate 10 can be accurately calculated only by calculating the distance between the third marker 33 and the fourth marker 34. Thus, substrate alignment can be precisely fulfilled.

In the substrate processing apparatus of the first embodiment, substrate alignment is performed in the substrate alignment operation by making a direction and midpoint of the third marker 33 and the fourth marker 34 accord with the direction and midpoint of the third marker 33 and the fourth marker 34 stored by the substrate calibration operation. However, in this invention, the substrate alignment may also be performed in the substrate alignment operation by making a direction and midpoint of the first marker 31 and the second marker 32 accord with the direction and midpoint of the first marker 31 and the second marker 32 stored by the substrate calibration operation.

Further, in the substrate processing apparatus of the first embodiment, after execution of substrate alignment, the ink is ejected to the substrate based on the substrate alignment. However, the substrate processing apparatus of this invention may also be such an apparatus that, after execution of substrate alignment, cuts desired places on the substrate or removes foreign matters on the substrate by applying laser light or plasma for the substrate based on the substrate alignment.

Second Embodiment

Figure 14:
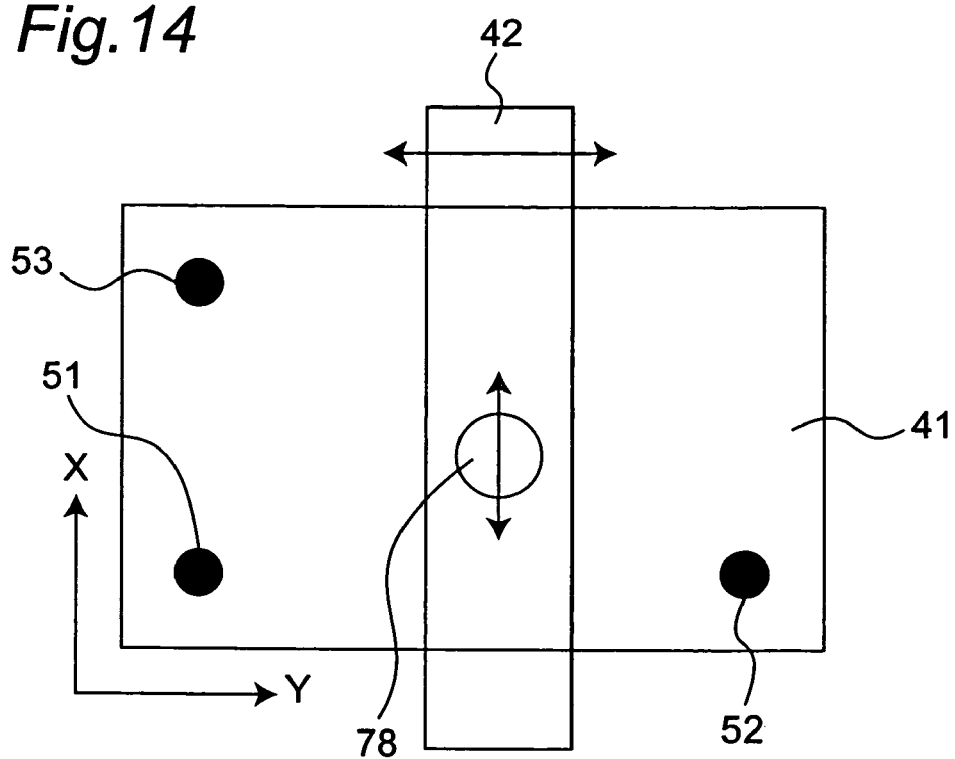
FIG. 14 is a schematic view showing a substrate processing apparatus according to a second embodiment under a calibration operation of the substrate.
Figure 15:
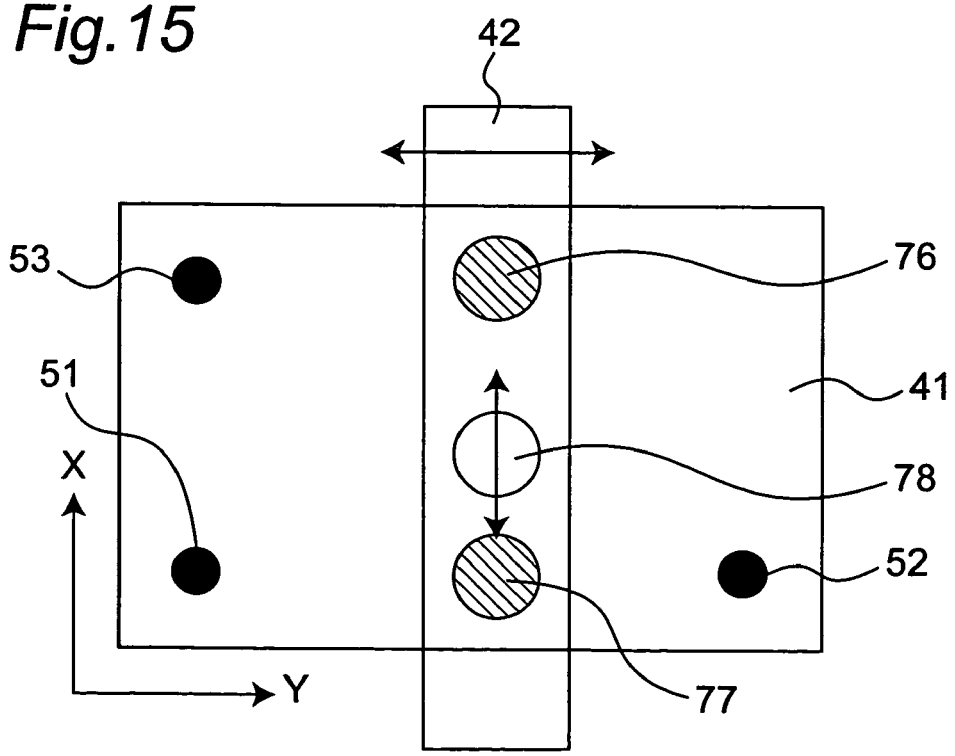
FIG. 15 is a schematic view showing the substrate processing apparatus according to the second embodiment under an alignment operation of the substrate.

FIG. 14 is a schematic view of a substrate processing apparatus according to a second embodiment under a calibration operation of a substrate 41. FIG. 15 is a schematic view showing the substrate processing apparatus according to the second embodiment under an alignment operation of the substrate 41. It is noted that in FIG. 14, a first camera 76 and a second camera 77 are not shown.

The substrate processing apparatus of the second embodiment differs from the substrate processing apparatus of the first embodiment in that not four markers but three markers of the substrate 41, i.e., a first marker 51, a second marker 52 and a third marker 53 are used to perform alignment of the substrate 41, or in that the camera used for calibration of the substrate 41 is a movable camera 78 alone.

In the substrate processing apparatus of the second embodiment, the same component members as those of the substrate processing apparatus of the first embodiment are designated by the same reference numerals and their description is omitted. Also with the substrate processing apparatus of the second embodiment, description as to functional effects and modifications common to the substrate processing apparatus of the first embodiment is omitted and only differences in construction from the substrate processing apparatus of the first embodiment are described below.

Hereinbelow, a substrate calibration operation and a substrate alignment operation with the substrate processing apparatus of the second embodiment are explained in this order.

First, the substrate calibration operation is carried out in the following manner. First, the first marker 51 is observed by the movable camera 78, and an observed image is outputted to a control unit (not shown), by which a position of the first marker 51 is stored in the control unit. Subsequently, with a gantry 42 moved in the GanY direction, the second marker 52 is observed by the movable camera 78, and an observed image is outputted to the control unit, by which a position of the second marker 52 is stored in the control unit.

Thereafter, the substrate placing table is rotated so that a line connecting the first marker 51 and the second marker 52 accords with the GanY direction, which is the moving direction of the gantry 42.

Subsequently, the third marker 53 is observed by the movable camera 78, and an observed image is outputted to the microcomputer as a control unit, by which a position of the third marker 53 is stored in a storage section of the control unit. Then, a deviation amount including both a perpendicularity deviation of the substrate 41 and a perpendicularity deviation of the substrate placing table is calculated from a relative distance difference between the position of the first marker 51 and the position of the third marker 53. Also, a position of a midpoint of the first marker 51 and the third marker 53, and a distance between the first marker 51 and the third marker 53 is measured, and those are stored in the storage section.

It is noted here that the perpendicularity deviation of the substrate 41 refers to a deviation amount from a perpendicularity of the X direction and the Y direction of a substrate pattern, i.e., a deviation amount from a perpendicularity between one direction of array of a plurality of ink ejection areas and the other direction of array of the plurality of ink ejection areas in a two-dimensional plane of the substrate 41.

Further, although the gantry 42 is placed so as to stretch over the substrate placing table in one direction of the substrate placing table, yet the extending direction of the gantry 42 is not necessarily coincident with the one direction of the substrate placing table. The term, perpendicularity deviation, of the substrate placing table refers to a deviation amount from a perpendicularity between the other direction of the substrate placing table and the extending direction of the gantry 42.

Besides, the perpendicularity deviation of the substrate 41, needless to say, does not vary among substrates made with one identical mask, i.e., substrates made within one identical lot. It is also needless to say that the perpendicularity deviation of the substrate placing table does not vary.

Next, the substrate alignment operation is carried out in the following manner.

With the gantry 42 moved, the third marker 53 is observed by the first camera 76 fixed at a specified position of the gantry 42, and an observed image is outputted to the control unit, by which a position of the third marker 53 is stored in the control unit. While this process goes on, simultaneously, the first marker 51 is observed by the second camera 77 fixed at a specified position of the gantry 42, and an observed image is outputted to the control unit, by which a position of the first marker 51 is stored in the control unit.

Thereafter, the substrate placing table is rotated and translated so that a direction and midpoint of the first marker 51 and the third marker 53 and the direction and midpoint of the first marker 51 and the third marker 53 stored by the substrate calibration operation accord with each other. The substrate alignment operation is carried out in this way. Further, correction of expansion of the substrate 41 is carried out by measuring the distance between the first marker 51 and the third marker 53, as in the first embodiment. Also in the second embodiment, move amounts of the substrate placing table in the substrate alignment operation can be made far less than the conventional, like the first embodiment, so that the substrate alignment operation can be achieved with high speed. Furthermore, expansion of the substrate 41 can be accurately detected, so that the substrate alignment operation can be accurately achieved for each of the substrates 41.

The invention claimed is:

1. A substrate processing apparatus comprising:
    a substrate placing table having a placing surface for placing a substrate thereon;
    a processing section for processing the substrate on the substrate placing surface;
    a relative position changing device for changing a relative position of the substrate on the placing surface relative to the processing section;
    an image pickup section holding member which is fitted to the substrate placing table so as to be movable in a first direction relative to the placing surface and which has a facing section facing a normal direction of the placing surface and extending along a second direction;
    an image pickup section which is fitted to the facing section and which can pick up images of a first marker, a second marker and a third marker formed on the substrate placed on the placing surface;
    a storage section which can store a position of the first marker on the substrate and a position of the third marker on the substrate; and
    a control unit for performing control comprising,
        a first control, based on a signal from the image pickup section, to make the relative position changing device change the relative position so that a direction of a line connecting the first marker and the second marker accords with the first direction,
        a second control, based on a signal from the image pickup section, to store positions of the first marker and the third marker in a state that the direction of the line connecting the first marker and the second marker accords with the first direction, and
        a third control, based on a signal from the image pickup section that has picked up an image of a substrate other than the foregoing substrate of which the positions of the first marker and the third marker have been stored in the storage section, to make the relative position changing device change a relative position of the other substrate relative to the processing section so that a direction of a line connecting a first marker and a third marker on the other substrate accords with a direction of a line connecting the first marker and the third marker calculated from the positions of the first marker and the third marker stored in the storage section.

2. The substrate processing apparatus as claimed in claim 1, wherein
    in the third control, the control unit makes the relative position changing device change the relative position of the other substrate relative to the processing section so that a midpoint of the line connecting the first marker and the third marker on the other substrate accords with a midpoint of a line connecting the first marker and the third marker calculated from the positions of the first marker and the third marker stored in the storage section.

3. The substrate processing apparatus as claimed in claim 1, wherein
    the control unit calculates a ratio of a distance between the first marker and the third marker on the other substrate to a distance between the first marker and the third marker calculated from the positions of the first marker and the third marker stored in the storage section.

4. The substrate processing apparatus as claimed in claim 1, wherein
    the image pickup section has a first camera and a second camera which are both immovably fixed to the image pickup section holding member, and a movable camera fitted to the image pickup section holding member so as to be movable in the second direction, and
    the control unit, in the third control, specifically determines a direction of a line connecting the first marker and the third marker on the other substrate based on a signal from the first camera that has picked up an image of the third marker of the other substrate and a signal from the second camera that has picked up an image of the first marker of the other substrate.

5. The substrate processing apparatus as claimed in claim 1, wherein
the image pickup section has a first camera and a second camera both immovably fixed to the image pickup section holding member, and a movable camera fitted to the image pickup section holding member so as to be movable in the second direction, and
the control unit, in the first control, specifically determines a direction of a line connecting the first marker and the second marker based on positions of the first marker and the second marker image-picked up by the movable camera and, in the second control, stores in the storage section the positions of the first marker and the second marker image-picked up by the movable camera.

6. The substrate processing apparatus as claimed in claim 1, wherein a droplet ejecting section for ejecting droplets toward a substrate is mounted on the image pickup section holding member so as to be movable or immovable in the second direction relative to the image pickup section holding member.

7. A substrate processing apparatus comprising:
a substrate placing table having a placing surface for placing a substrate thereon;
a processing section for processing the substrate on the placing surface;
a relative position changing device for changing a relative position of the substrate on the placing surface relative to the processing section;
an image pickup section holding member which is fitted to the substrate placing table so as to be movable in a first direction relative to the placing surface and which has a facing section facing a normal direction of the placing surface and extending along a second direction;
an image pickup section which is fitted to the facing section and which can pick up images of a first marker, a second marker,
a third marker and a fourth marker formed on the substrate placed on the placing surface;
a storage section which can store a position of the third marker on the substrate and a position of the fourth marker on the substrate; and
a control unit for performing control comprising,
a first control, based on a signal from the image pickup section, to make the relative position changing device change the relative position so that a direction of a line connecting the first marker and the second marker accords with the first direction,
a second control, based on a signal from the image pickup section, to store positions of the third marker and the fourth marker in a state that the direction of the line connecting the first marker and the second marker accords with the first direction, and
a third control, based on a signal from the image pickup section that has picked up an image of a substrate other than the foregoing substrate of which the positions of the third marker and the fourth marker have been stored in the storage section, to make the relative position changing device change a relative position of the other substrate relative to the processing section so that a direction of a line connecting a third marker and a fourth marker on the other substrate accords with a direction of a line connecting the third marker and the fourth marker calculated from the positions of the third marker and the fourth marker stored in the storage section.

8. The substrate processing apparatus as claimed in claim 7, wherein in the third control, the control unit makes the relative position changing device change the relative position of the other substrate relative to the processing section so that a midpoint of the line connecting the third marker and the fourth marker on the other substrate accords with a midpoint of a line connecting the third marker and the fourth marker calculated from the positions of the third marker and the fourth marker stored in the storage section.

9. The substrate processing apparatus as claimed in claim 7, wherein the control unit calculates a ratio of a distance between the third marker and the fourth marker on the other substrate to a distance between the third marker and the fourth marker calculated from the positions of the third marker and the fourth marker stored in the storage section.

10. The substrate processing apparatus as claimed in claim 7, wherein
the image pickup section has a first camera and a second camera both immovably fixed to the image pickup section holding member, and a movable camera fitted to the image pickup section holding member so as to be movable in the second direction, and wherein,
in the third control, the control unit specifically determines a direction of a line connecting the third marker and the fourth marker on the other substrate based on a signal from the first camera that has picked up an image of the fourth marker of the other substrate and a signal from the second camera that has picked up an image of the third marker of the other substrate.

11. The substrate processing apparatus as claimed in claim 7, wherein
the image pickup section has a first camera and a second camera both immovably fixed to the image pickup section holding member, and a movable camera fitted to the image pickup section holding member so as to be movable in the second direction, and wherein,
in the first control, the control unit specifically determines a direction of a line connecting the first marker and the second marker based on positions of the first marker and the second marker image-picked up by the movable camera and,
in the second control, the control unit stores in the storage section the positions of the third marker and the fourth marker image-picked up by the movable camera.

12. The substrate processing apparatus as claimed in claim 7, wherein a droplet ejecting section for ejecting droplets toward a substrate is mounted on the image pickup section holding member so as to be movable or immovable in the second direction relative to the image pickup section holding member.

13. A substrate processing method comprising the steps of:
placing a first substrate on a placing surface of a substrate placing table, and drawing a line connecting a first marker and a second marker, making a direction of the line connecting the first marker and the second marker accord with a first direction of an image pickup section holding member which is mounted on the substrate placing table so as to be movable in the first direction relative to the placing surface and which extends along a second direction;
storing a position of the first marker and a position of a third marker on the first substrate in a state that a direction of the line connecting the first marker and the second marker accords with the first direction; and placing a second substrate on the placing surface of the substrate placing table, making a line connecting a first marker and a third marker on the second substrate accord with a direction a line connecting the first marker and the third marker on the first substrate calculated based on the position of the first marker and the position of the third marker on the first substrate stored in the storage section.

14. The substrate processing method as claimed in claim 13, further comprising the step of:

drawing a line connecting the first marker and the third marker on the second substrate placed on the placing surface of the substrate placing table, and making a midpoint of the line connecting the first marker and the third marker on the second substrate accord with a midpoint of a line connecting the first marker and the third marker on the first substrate calculated based on the position of the first marker and the position of the third marker on the first substrate stored in the storage section.

15. The substrate processing method as claimed in claim 13, further comprising the step of:

calculating a ratio of a distance between the first marker and the third marker on the second substrate to a distance between the first marker and the third marker on the first substrate calculated based on the position of the first marker and the position of the third marker on the first substrate stored in the storage section.

16. A substrate processing method comprising the steps of:

placing a first substrate on a placing surface of a substrate placing table, and drawing a line connecting a first marker and a second marker, making a direction of the line connecting the first marker and the second marker accord with a first direction of an image pickup section holding member which is mounted on the substrate placing table so as to be movable in the first direction relative to the placing surface and which extends along a second direction;

storing a position of a third marker and a position of a fourth marker on the first substrate in a state that a direction of the line connecting the first marker and the second marker accords with the first direction; and placing a second substrate on the placing surface of the substrate placing table, and drawing a line connecting a third marker and a fourth marker on the second substrate, and making the line connecting the third marker and the fourth marker on the second substrate accord with a direction of a line connecting the third marker and the fourth marker on the first substrate calculated based on the position of the third marker and the position of the fourth marker on the first substrate stored in the storage section.

17. The substrate processing method as claimed in claim 16, further comprising the step of:

drawing the line connecting the third marker and the fourth marker on the second substrate placed on the placing surface of the substrate placing table, and making a midpoint of the line connecting the third marker and the fourth marker on the second substrate accord with a midpoint of the line connecting the third marker and the fourth marker on the first substrate calculated based on the position of the third marker and the position of the fourth marker on the first substrate stored in the storage section.

18. The substrate processing method as claimed in claim 16, further comprising the step of:

calculating a ratio of a distance between the third marker and the fourth marker on the second substrate to a distance between the third marker and the fourth marker on the first substrate calculated based on the position of the third marker and the position of the fourth marker on the first substrate stored in the storage section.

* * * * *